United States Patent [19]
Spence

[11] Patent Number: 6,134,165
[45] Date of Patent: Oct. 17, 2000

[54] HIGH SPEED SENSING OF DUAL PORT STATIC RAM CELL

[75] Inventor: John R. Spence, Villa Park, Calif.

[73] Assignee: Conexant Systems, Inc., Newport Beach, Calif.

[21] Appl. No.: 09/467,285

[22] Filed: Dec. 20, 1999

Related U.S. Application Data

[62] Division of application No. 09/106,325, Jun. 29, 1998, Pat. No. 6,028,801.

[51] Int. Cl.[7] ........................................ G11C 7/00
[52] U.S. Cl. ..................... 365/205; 365/203; 365/207; 365/208
[58] Field of Search .................... 365/203, 205, 365/207, 208

[56] References Cited

U.S. PATENT DOCUMENTS 5,896,328   4/1999   Tanizaki et al. ........................ 365/203

*Primary Examiner*—Trong Phan
*Attorney, Agent, or Firm*—Farjami & Farjami LLP

[57] ABSTRACT

The invention's reference precharge circuit and bit line precharge circuits are comprised of two NFET transistors and one PFET transistor. In the preferred embodiment of the invention where the supply voltage is 3.0 volts, the two NFET transistors result in a voltage drop of 2.0 volts so as to produce a reference precharge signal or a bit line precharge signal having a voltage of 1.0 volts. When a precharge enable signal is on, the PFET transistor is connected to ground and is barely on such that the path from the reference precharge signal or the bit line precharge signal to ground is a low impedance path. Moreover, the path from the reference precharge signal or the bit line precharge signal to the supply voltage is also of low impedance. Accordingly, the voltages present at the reference precharge signal or the bit line precharge signal are substantially noise free. The invention also utilizes a unique sense amp that quickly detects changes in the voltage level of a bit line in relation to the voltage level of the reference precharge signal. The sense amp uses an NFET transistor driven by the reference precharge signal which causes the NFET transistor to barely conduct-current. This results in dramatically increasing the reaction time of the invention's sense amp. Moreover, because the invention utilizes low bit line and reference precharge voltages, the invention's sense amp is very sensitive to small changes in the bit line voltage relative to the reference precharge voltage.

18 Claims, 5 Drawing Sheets

HIGH SPEED SENSING OF DUAL PORT STATIC RAM CELL

This is a division of application Ser. No. 09/106,325 filed Jun. 29, 1998 now U.S. Pat. No. 6,028,801.

BACKGROUND OF THE INVENTION

1. Field of the Invention

The present invention relates to the field of static random access memories (RAMs). More specifically, the present invention relates to reading and sensing the contents of a static RAM cell.

2. Background Art

According to one known technique in static RAM arrays, in order to access and read two RAM cells, two read cycles are required. Referring to FIG. 1, two conventional and identical RAM cells 12 are shown in FIG. 1. Each RAM cell 12 consists of inverters 14 and access transistors 16. Access transistors 16 are driven by word lines 28. Complementary bit lines 24 and 26 are driven by RAM cells 12 and access transistors 16. Differential sense amp 20 receives its two inputs from Complementary bit lines 24 and 26. Output 22 of differential sense amp 20 indicates whether a "1" or a "0" has been read from the particular RAM cell accessed by a particular word line 28.

RAM cells 12 are accessed and read using a conventional technique. During each read cycle, a single word line 28 is enabled (i.e., driven high). That single enabled word line turns on the two access transistors 16 belonging to a single RAM cell. When the two access transistors are turned on, one of the bit lines 24 or 26 is driven high while the other bit line is driven low (if the bit lines had been precharged in a previous clock cycle, one of the bit lines remains high while the other one goes low). The difference in voltage between the two bit lines 24 and 26 is detected by differential sense amp 20 and outputted on line 22. From the above explanation it is apparent that two read cycles are necessary in order to read from two different RAM cells. In other words, during each read cycle only a single RAM cell can be accessed and read.

A known improvement over the conventional technique of FIG. 1 is shown in FIG. 2. According to the improved RAM design shown in FIG. 2, two different RAM cells can be accessed and read simultaneously during a single read cycle. RAM cells 32 are identical and each consists of inverters 34 and access transistors 36. In each RAM cell, one access transistor 36 is driven by word lines 38 while the other access transistor 36 is driven by word lines 39. In order to access each RAM cell 32 only one of word lines 38 or 39 need be enabled. In fact, the word line drivers (not shown in any of the Figures) operate such that when word line 38 of a particular RAM cell is high, word line 39 of that same RAM cell is driven low (and vice versa, i.e. if word line 38 is low, word line 39 is driven high). Accordingly, during each read cycle, only one of the two access transistors 36 in a RAM cell of interest is enabled.

A precharge circuit consisting of transistor 42 is used so that when precharge signal 40 is high, the bit lines are precharged prior to the beginning of a read operation. The precharge voltage is between 2.0 volts and 4.0 volts corresponding to a supply voltage between 3.0 volts and 5.0 volts. During a single read cycle, while word line 38 of a particular RAM cell is enabled, word line 39 of a different RAM cell can be enabled. Referring to FIG. 2, while word line 38 of the top RAM cell is enabled, during the same read cycle, word line 39 of the bottom RAM cell is enabled. Thus, while the top RAM cell in FIG. 2 drives bit line 46, the bottom RAM cell drives bit line 44. Sense amp 56 detects any change in the voltage of bit line 46 while sense amp 54 detects changes in the voltage of bit line 44. Sense amp 56 provides the result of the read operation of the top RAM cell on output 57 while sense amp 54 provides the results of the read operation of the bottom RAM cell on output 55. It is apparent that according to the known technique described in relation to FIG. 2, during a single read cycle two different RAM cells can be simultaneously accessed and read.

It is noted that in both the conventional RAM designs shown in FIGS. 1 and 2, the sense amps are designed to work with large precharge voltages, i.e. precharge voltages of 2.0 volts and above. Moreover, the precharge circuits of the conventional RAM arrays typically produce a relatively noisy precharge voltage. Since the relatively noisy output of the conventional precharge circuits appears directly on the bit lines, the sense amps used in conventional RAM arrays cannot be designed to be very sensitive to voltage fluctuations on the bit lines.

The conventional RAM cells described in relation to FIGS. 1 and 2 and their resulting RAM arrays suffer from several shortcomings. One shortcoming of the conventional RAM arrays is that the time it takes to read data from an accessed RAM cell is too long. In other words, the time it takes for the RAM cell to cause a change in the voltage of a bit line and the time it takes for the change in the bit line voltage to be detected by the sense amp are both too long. Another shortcoming of the conventional RAM arrays is that their sense amps do not work well with low bit line voltages and, moreover, the sense amps do not readily detect very small changes in the bit line voltage. Still another shortcoming of the conventional RAM arrays is that the conventional precharge circuits that are designed to precharge RAM bit lines to a low voltage are complicated and further the precharge circuits do not provide a substantially noiseless precharge voltage.

Thus, there is serious need in the art for a RAM cell and a RAM array design that utilizes stable and substantially noiseless and low bit line precharge voltages. There is also a need for simple precharge circuits that can generate substantially noiseless and low bit line precharge voltages. Moreover, there is need in the art to reduce the time it takes for an accessed RAM cell to cause a change in the bit line voltage and there is further need to reduce the time it takes for small changes in the bit line voltage to be detected by the RAM array sense amps.

SUMMARY OF THE INVENTION

The present invention addresses high speed sensing of a dual port static RAM cell. The invention provides a stable and substantially noiseless and low bit line and reference precharge voltages. Moreover, the invention's low precharge voltage of 1.0 volts results in a reduction in the time it takes for an accessed RAM cell to cause a change in the bit line voltage. Furthermore, the invention's unique sense amp reduces the time it takes for small changes in the bit line voltage to be detected.

The invention's reference precharge circuit and bit line precharge circuits are comprised of two NFET transistors and one PFET transistor. In the preferred embodiment of the invention where the supply voltage is 3.0 volts, the two NFET transistors result in a voltage drop of 2.0 volts so as to produce a reference precharge signal or a bit line precharge signal having a voltage of 1.0 volts. When a precharge enable signal is on, the PFET transistor is connected to ground and is barely on such that the path from the reference precharge signal or the bit line precharge signal to ground is a low impedance path. Moreover, the path from the reference precharge signal or the bit line precharge signal to the supply voltage is also of low impedance Accordingly, the voltages present at the reference precharge signal or the bit line precharge signal are substantially noise free.

The invention also utilizes a unique sense amp that quickly detects changes in the voltage level of a bit line in relation to the voltage level of the reference precharge signal. The sense amp uses an NFET transistor driven by the reference precharge signal which causes the NFET transistor to barely conduct current. This results in dramatically increasing the reaction time of the invention's sense amp. Moreover, because the invention utilizes low bit line and reference precharge voltages, the invention's sense amp is very sensitive to small changes in the bit line voltage relative to the reference precharge voltage.

DETAILED DESCRIPTION OF THE INVENTION

The present invention addresses high speed sensing of a dual port static RAM cell. Although the invention is described with respect to certain specific embodiments, the principles of the invention, as defined by the claims appended herein, can obviously be applied beyond the specifically described embodiments. Moreover, in the description of the present invention, certain details have been left out in order to not obscure the inventive aspects of the invention. The details left out are within the knowledge of a person of ordinary skill in the art and can be filled in by such a person.

Figure 1:
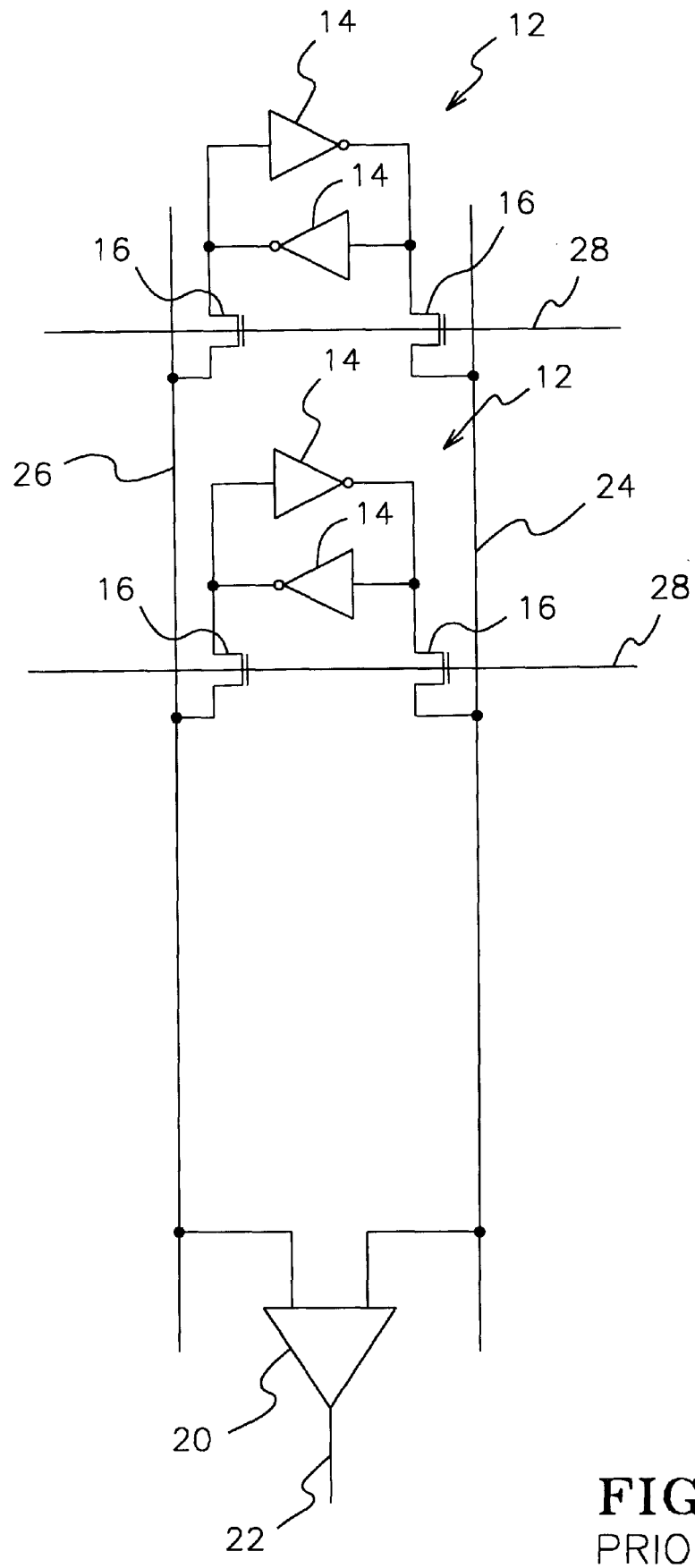
FIG. 1 illustrates a prior art RAM array using a sense amp for every two bit lines.
Figure 2:
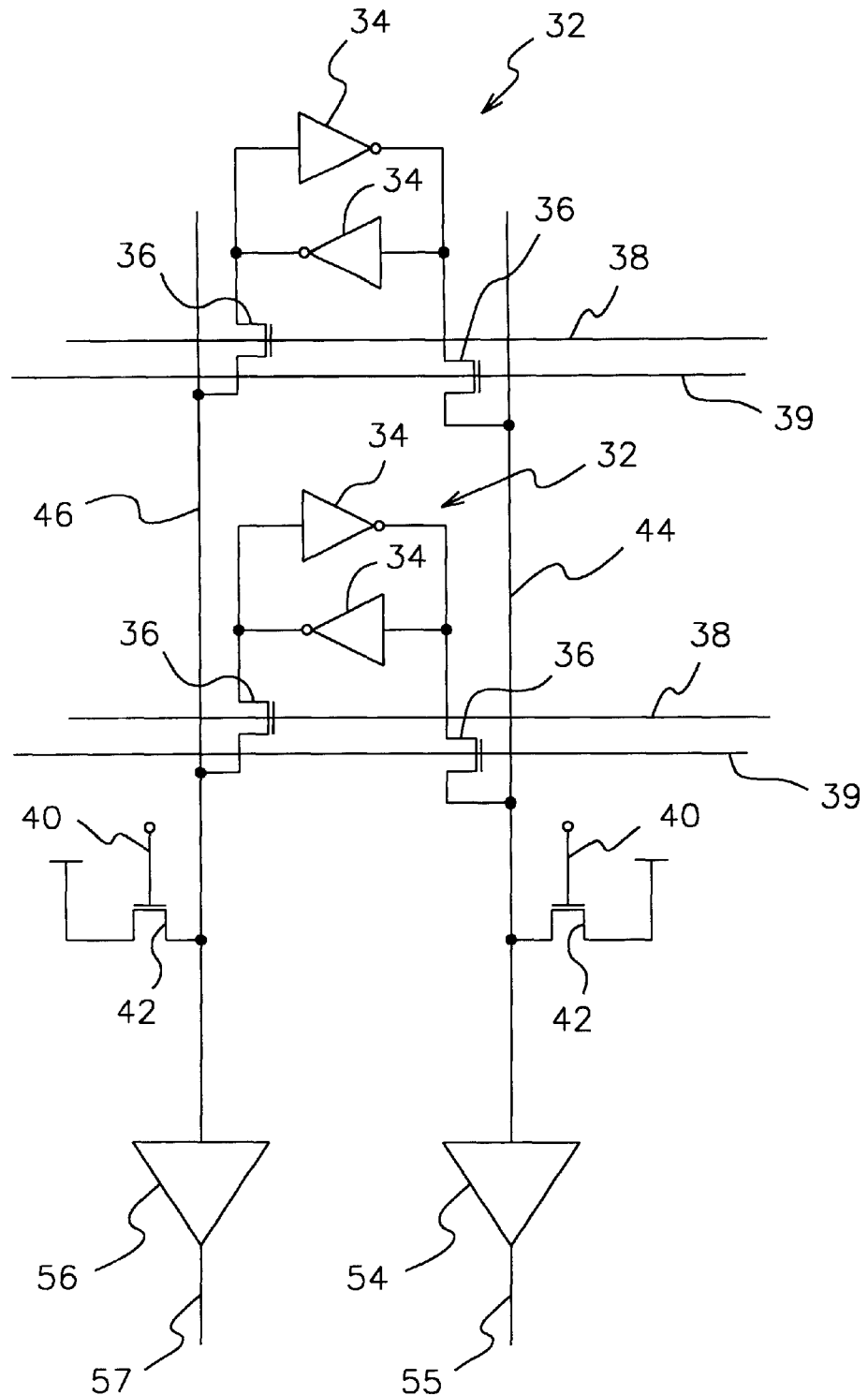
FIG. 2 illustrates a prior art dual port RAM array using a separate sense amp for each bit line.
Figure 3:
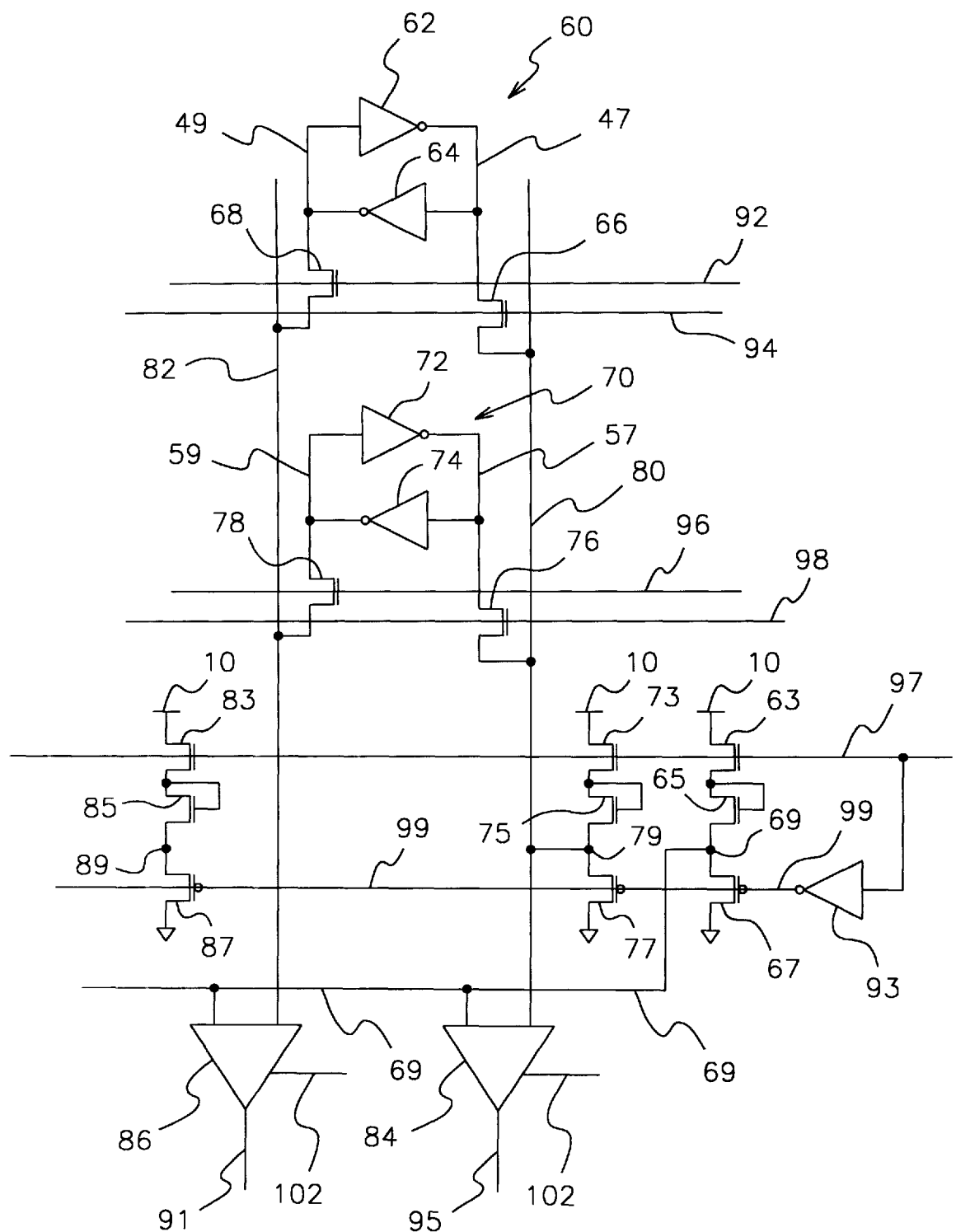
FIG. 3 illustrates the invention's reference precharge circuit and bit line precharge circuits and the RAM array bit lines and sense amps.

FIG. 3 shows RAM cell 60 which is comprised of inverters 62 and 64 and access transistors 66 and 68. Inverters 62 and 64 are cross-coupled, i.e. the output of inverter 62 provides the input for inverter 64 and vice versa. Access transistors 66 and 68 are NFET (N-channel Field Effect Transistor) transistors. The gate of NFET access transistor 66 is driven by word line 94 while the gate of NFET access transistor 68 is driven by word line 92. The drain of transistor 66 is connected to node 47 which is both the output of inverter 62 and the input of inverter 64. The source of access transistor 66 is connected to bit line 80 of the static RAM array. Similarly, the drain of transistor 68 is connected to node 49 which is both the output of inverter 64 and the input of inverter 62. The source of access transistor 68 is connected to bit line 82 of the static RAM array.

RAM cell 70 is a cell in the RAM array that is also coupled to bit lines 80 and 82. RAM cell 70 comprises cross-coupled inverters 72 and 74 and NFET access transistors 76 and 78. The gate of access transistor 76 is driven by word line 98 while the gate of access transistor 78 is driven by word line 96. The drain of transistor 76 is connected to node 57 which is both the output of inverter 72 and the input of inverter 74. The source of access transistor 76 is connected to bit line 80 of the RAM array. Similarly, the drain of transistor 78 is connected to node 59 which is both the output of inverter 74 and the input of inverter 72. The source of access transistor 78 is connected to bit line 82 of the static RAM array.

Transistors 63, 65, and 67 comprise a reference precharge circuit which provides a reference precharge signal 69. Although FIG. 3 shows reference precharge signal 69 feeding only two sense amps 84 and 86, reference precharge signal 69 is in fact provided to a large number of sense amps that are not shown in FIG. 3. Transistors 63 and 65 are NFET transistors while transistor 67 is a PFET (P-channel Field Effect Transistor) transistor. The gate of NFET transistor 63 is driven by precharge enable signal 97. The drain of NFET transistor 63 is connected to supply voltage 10 (also called the "VDD") while the source of transistor 63 is connected to the drain and gate of transistor 65.

The source of NFET transistor 6 5 is connected to the drain of PFET transistor 67 while the drain of transistor 65 is connected to the source of transistor 63. The gate of transistor 65 is connected to the drain of transistor 65, thus, the gate of transistor 65 is also connected to the source of transistor 63. The drain of PFET transistor 67 is connected to the source of NFET transistor 65. The gate of transistor 67 is driven by line 99 which is the output of inverter 93 whose input is precharge enable signal 97. Thus, the signal present on line 99 is an inverse signal of precharge enable signal 97. The source of PFET transistor 67 is connected to ground. Common node 69 which is formed by the connection of drain of transistor 67 and source of transistor 65 is the output of the reference precharge circuit. This output provided at node 69 is also called the reference precharge signal.

Transistors 73, 75, and 77 comprise a bit line precharge circuit which precharges bit line 80 when precharge enable signal 97 is high. Transistors 73 and 75 are NFET transistors while transistor 77 is a PFET transistor. The gate of transistor 73 is driven by precharge enable signal 97. The drain of transistor 73 is connected to supply voltage 10 (VDD) while the source of transistor 73 is connected to the drain and gate of transistor 75. The source of NFET transistor 75 is connected to the drain of PFET transistor 77 while the drain of transistor 75 is connected to the source of transistor 73. The gate of transistor 75 is connected to the drain of transistor 75; the gate of transistor 75 is also connected to the source of transistor 73. The drain of transistor 77 is coupled to the source of NFET transistor 75. The gate of transistor 77 is driven by line 99 which is the output of inverter 93. The source of PFET transistor 77 is connected to ground. Common node 79 which is formed by the connection of drain of transistor 77 and source of transistor 75 is the output of the bit line precharge circuit. This output provided at common node 79 precharges bit line 80 in a manner explained later in this application. Common node 79 is also called bit line precharge signal.

Transistors 83, 85, and 87 comprise a bit line precharge circuit which precharges bit line 82 when precharge enable signal 97 is high. Transistors 83 and 85 are NFET transistors while transistor 87 is a PFET transistor. The gate of transistor 83 is driven by precharge enable signal 97. The drain of transistor 83 is connected to supply voltage 10 (VDD) while the source of transistor 83 is connected to the drain and gate of transistor 85. The source of NFET transistor 85 is connected to the drain of PFET transistor 87 wile the drain of transistor 85 is connected to the source of transistor 83.

The gate of transistor 85 is connected to the drain of transistor 85; the gate of transistor 85 is also connected to the source of transistor 83. The drain of transistor 87 is coupled to the source of NFET transistor 85. The gate of of transistor 87 is driven by line 99 which is the output of inverter 93. The source of PFET transistor 87 is connected to ground. Common node 89 which is formed by the connection of drain of transistor 87 and source of transistor 85 is the output of the bit line precharge circuit. Is output provided at common node 89 precharges bit line 82 in a manner explained later in this application. Common node 89 is also called bit line precharge signal.

Sense amp 84 has one of its inputs connected to the reference precharge signal 69 and the other to bit line 80. Output 95 of sense amp 84 indicates whether a "1" or a "0" has been read from a particular RAM cell. Latch sense amp signal 102 activates sense amp 84 to begin sensing the voltage on bit line 80 and latches the state of output 95 of sense amp 84 in a maimer explained later in this application. Sense amp 86 has one of its inputs connected to the reference precharge signal 69 and the other to bit line 82. Output 91 of sense amp 86 indicates whether a "1" or a "0" has been read from a particular RAM cell. Latch sense amp signal 102 activates sense amp 86 to begin sensing the voltage on bit line 82 and latches the state of output 91 of sense amp 86 in a manner explained later in this application.

Figure 4:
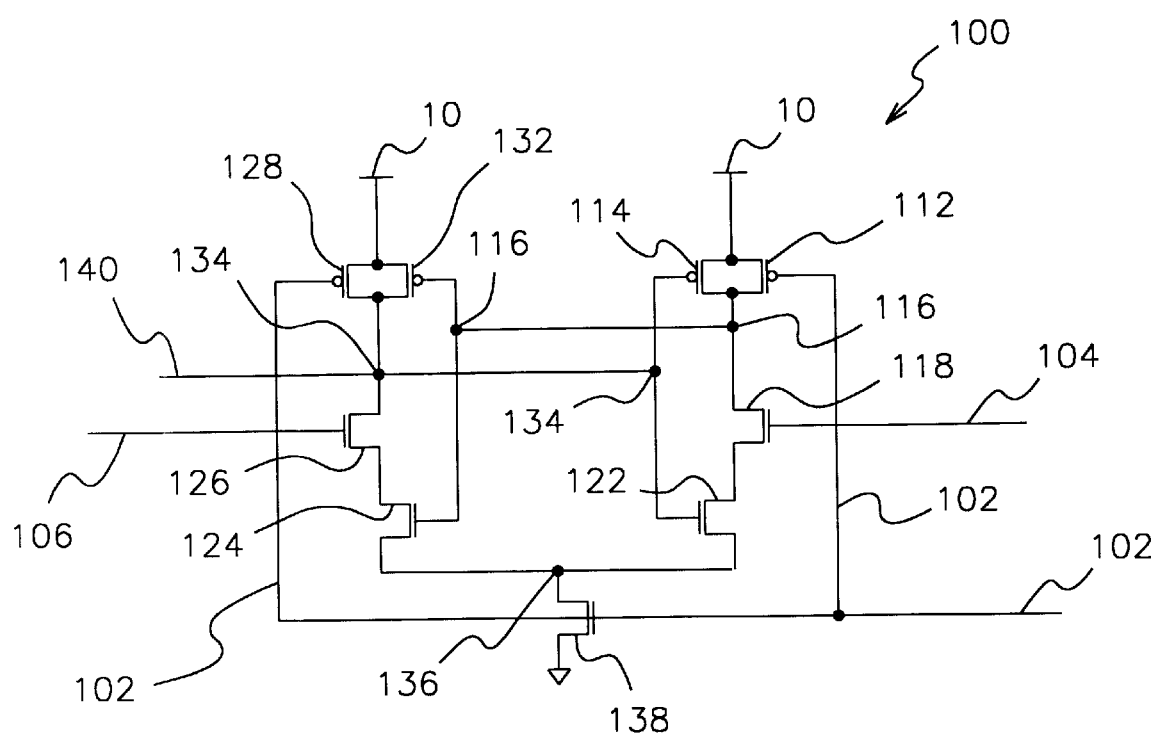
FIG. 4 illustrates the preferred embodiment of the invention's sense amp.

FIG. 4 shows a preferred embodiment of a sense amp according to the present invention. Sense amp 100 shown in FIG. 4 is the preferred sense amp to be used as sense amp 84 and sense amp 86 in FIG. 3. As shown in FIG. 4, a first leg of sense amp 100 is comprised of PFET transistors 112, 114, and NFET transistors 118 and 122. A second leg of sense amp 100 is comprised of PFET transistors 128, 132, and NFET transistors 126 and 124. The first and second legs of sense amp 100 are joined at node 136.

PFET transistor 112 is also called the "latch sense amp first PFET transistor" since PFET transistor 1212 is driven by latch sense amp signal 102 and since PFET transistor 112 is a transistor in the first leg (as opposed to the second leg) of sense amp 100. Similarly, PFET transistor 128 i s also called the "latch sense amp second PFET transistor" since PFET transistor 128 is also driven by latch sense amp signal 102 and since PFET transistor 128 is a transistor in the second leg (as opposed to the first leg) of sense amp 100.

PFET transistor 114 is called the "first pull-up transistor" since PFET transistor 114 can pull node 116 high (node 116 is also called the "first leg output node"). Moreover, PFET transistor 114 is a part of the first leg (as opposed to the second leg) of sense amp 100. Likewise, PFET transistor 132 is called the "second pull-up transistor" since PFET transistor 132 can pull node 134 high (node 134 is also called the "second leg output node"). Moreover, PFET transistor 132 is a part of the second leg (as opposed to the first leg) of sense amp 100.

NFET transistor 122 is also called the "first pull-down transistor" since NFET transistor 122 can pull node 116 low and since NFET transistor 122 is a part of the first leg (as opposed to the second leg) of sense amp 100. NFET transistor 124 is also called the "second pull-down transistor" since NFET transistor 124 can pull node 134 low and since NFET transistor 124 is a part of the second leg (as opposed to the first leg) of sense amp 100.

NFET transistor 118 is also called the "first input transistor" since NFET transistor 118 provides an input to the first l eg (as opposed to the second leg) of sense amp 100. NFET transistor 126 is also called the "second input transistor" since NFET transistor 126 provides an input to the second leg (as opposed to the first leg) of sense amp 100.

NFET transistor 138 is also called the "latch sense amp NFET transistor" since NFET transistor 1328 is t he only NFET transistor in sense amp 100 that is driven by latch sense amp signal 102.

Turning to the first leg of the sense amp, PFET transistor 112 ha s its source connected to supply voltage 10 (VDD) and its drain connected to node 116. As stated above, node 116 is also called the "first leg out put node." PFET transistor 114 has its source connected to supply voltage 10 (VDD) a nd its drain also connected to node 116. Thus, transistors 112 and 114 share a common source and a common drain. The gate of transistor 112 is driven by latch sense amp signal 102 while the gate of transistor 114 is connected to node 134. As stated above, node 134 is also called the "second leg output node." Node 134 is directly connected to sense amp output 140. Sense amp output 140 is the same as output 95 for sense amp 84 in FIG. 3 or the same as output 91 for sense amp 86 in FIG. 3.

NFET transistor 118 has its drain connected to node 116 and it s source connected to the drain of NFET transistor 122. The gate of transistor 118 is driven by a first input line 104. In the preferred embodiment of the sense amp shown in FIG. 4, input line 104 is directly connected to reference precharge signal 69 for both sense amps 84 and 86 shown in FIG. 3. NFET transistor 122 has its drain connected to the source of transistor 118 and has its source connected to node 136. The gate of transistor 122 is connected to node 134 which is also connected to output 140 of the sense amp.

Turning to the second leg of the sense amp, PFET transistor 132 has its source connected to supply voltage 10 (VDD) and its drain connected to node 134 which is also connected to sense amp output 140. PFET transistor 128 has its source connected to supply voltage 10 (VDD) and its drain connected to node 134. Thus, transistors 132 and 128 share a common source and a common drain. The gate of transistor 128 is driven by latch sense amp signal 102 while the gate of transistor 132 is connected to node 116.

NFET transistor 126 has its drain connected to node 134 and its source connected to the drain of NFET transistor 124. The gate of transistor 126 is driven by a second input line 106. In the preferred embodiment of the sense amp shown in FIG. 4, input line 106 is directly connected to bit line 80 in the case of sense amp 84 in FIG. 3 whereas input line 106 is directly connected to bit line 82 in the case of sense amp 86 in FIG. 3. NFET transistor 124 has its drain connected to the source of transistor 126 and has its source connected to node 136. The gate of transistor 124 is connected to node 116.

NFET transistor 138 has its drain connected to common node 136 which joins the first and second legs of sense amp 100. The source of transistor 138 is connected to ground while its gate is driven by latch sense amp signal 102. In the preferred embodiment of the present invention, one sense amp 100 is used for each bit line in the static RAM array. When sense amp 100 is used in the position of sense amp 84 in FIG. 3, bit line 80 is connected to input line 106 while input line 104 is connected to reference precharge signal 69. Latch sense amp signal 102 in FIG. 4 is the same as latch sense amp signal 102 feeding sense amp 84 in FIG. 3. In fact, the same latch sense amp signal 102 is routed to and connected to all sense amps. When sense amp 100 is used in the position of sense amp 84, output 140 of sense amp 100 functions as output 95 of sense amp 84.

Similarly, when sense amp 100 is used in the position of sense amp 86 in FIG. 3, bit line 82 is connected to input line 106 while input line 104 is connected to reference precharge signal 69. Latch sense amp signal 102 in FIG. 4 is the same as latch sense amp signal 102 feeding sense amp 86 in FIG. 3. When sense amp 100 is used in the position of sense amp 86, output 140 of sense amp 100 functions as output 91 of sense amp 86.

The operation of the invention's precharge circuits and the high speed sensing of the RAM cells is now described. Referring to FIG. 3, RAM cells 60 and 70 are addressable through access transistors 66, 68, 76, or 78. In other words, RAM cells 60 and 70 are addressed when access transistors 66, 68, 76, or 78 are enabled by their respective word lines. By way of background, when word line 92 makes a transition from low to high, access transistor 68 is turned on thus causing the value stored in RAM cell 60 to affect the voltage on bit line 82.

By way of further background, RAM cells 60 and 70 shown in FIG. 3 are dual port RAM cells. This means that each RAM cell can be read from two different access transistors. For example, RAM cell 60 can be read through either access transistor 66 or 68. Likewise, RAM cell 70 can be read from either access transistor 76 or 78. However, the word lines 92, 94, 96, and 98 are coordinated such that the access transistors that are coupled to the same bit line will not be simultaneously turned on. Thus, when word line 92 is high access transistor 68 causes data from RAM cell 60 to affect the voltage level on bit line 82. Therefore, word line 96 is forced to remain low to ensure that RAM cell 70 does not affect the voltage level on bit line 82. This means that in order to read data stored in RAM cell 70, word line 98 must go high to turn on access transistor 76. When access transistor 76 is turned on, data stored in RAM cell 70 affects the voltage level of bit line 80. Thus, word line 94 is forced low so that data stored in RAM cell 60 does not affect the voltage level of bit line 80.

By way of overview, the invention comprises a unique precharge circuit and technique and further a unique sensing circuit and technique in order to increase the speed with which data is read from an accessed RAM cell and also in order to provide a stable reference precharge signal to the sense amps.

Each bit line in the RAM array is precharged by using one of the invention's precharge circuits. Moreover, one of the invention's precharge circuits is used as a reference precharge circuit that is shared between a large number of sense amps in the RAM array. The RAM array also employs one of the invention's sense amps for each bit line. Since the invention's precharge circuits operate in the same manner, the operation of one of the three precharge circuit's shown in FIG. 3 is explained in this application. The precharge circuit explained here is the reference precharge circuit comprising transistors 63, 65, and 67.

When precharge enable signal 97 is high, NFET transistor 63 is tuned on. This causes the source of transistor 63 to rise to a voltage equal to VDD minus the threshold voltage of transistor 63. In the preferred embodiment of the invention, VDD is 3.0 volts and the threshold voltage of all NFET transistors is 1.0 volts. Thus, when precharge enable signal 97 is high, the source of transistor 63 rises to 2.0 volts. Thus, the drain of transistor 65 will also rise to 2.0 volts. Because the threshold voltage of NFET transistor 65 is also 1.0 volts, the voltage at node 69 rises only to 1.0 volts and stops at 1.0 volts. The reason is that the difference in voltage between the gate and source of transistor 65 must be 1.0 volts for transistor 65 to remain in a conducting mode. Accordingly, when the voltage at node 69 attempts to rise above 1.0 volts, transistor 65 stops conducting, thus preventing the voltage at node 69 from exceeding 1.0 volts.

When precharge enable signal 97 is high, output 99 of inverter 93 is low. Thus PFET transistor 67 gets turned on when precharge enable signal 97 goes high. It is noted that in the preferred embodiment of the invention the threshold voltage of all PFET transistors is also 1.0 volts. However, since the gate to drain voltage of transistor 67 is also 1.0 volts, transistor 67 is barely on. In this mode, transistor 67 conducts a minimal amount of current which causes node 69 to be a low impedance node. However, the current conducted by transistor 67 is not large enough to bring node 69 below 1.0 volts, In fact, if node 69 were to go below 1.0 volts, transistor 67 would be turned off. Thus, transistor 67 remains in a "limbo" state where a minimal amount of current is being conducted since the gate to drain voltage of transistor 67 is equal to its threshold voltage (i.e. the gate to drain voltage of transistor 67 is equal to 1.0 volts).

In the manner explained above, when precharge enable signal 97 goes high, reference precharge signal 69 makes a transition to 1.0 volts. Since the precharge circuit comprised of transistors 73, 75, and 77, and the precharge circuit comprised of transistors 83, 85, and 87 behave just like the reference precharge circuit, nodes 79 and 89 also make a transition to 1.0 volts when precharge enable signal 97 goes high.

Figure 5:
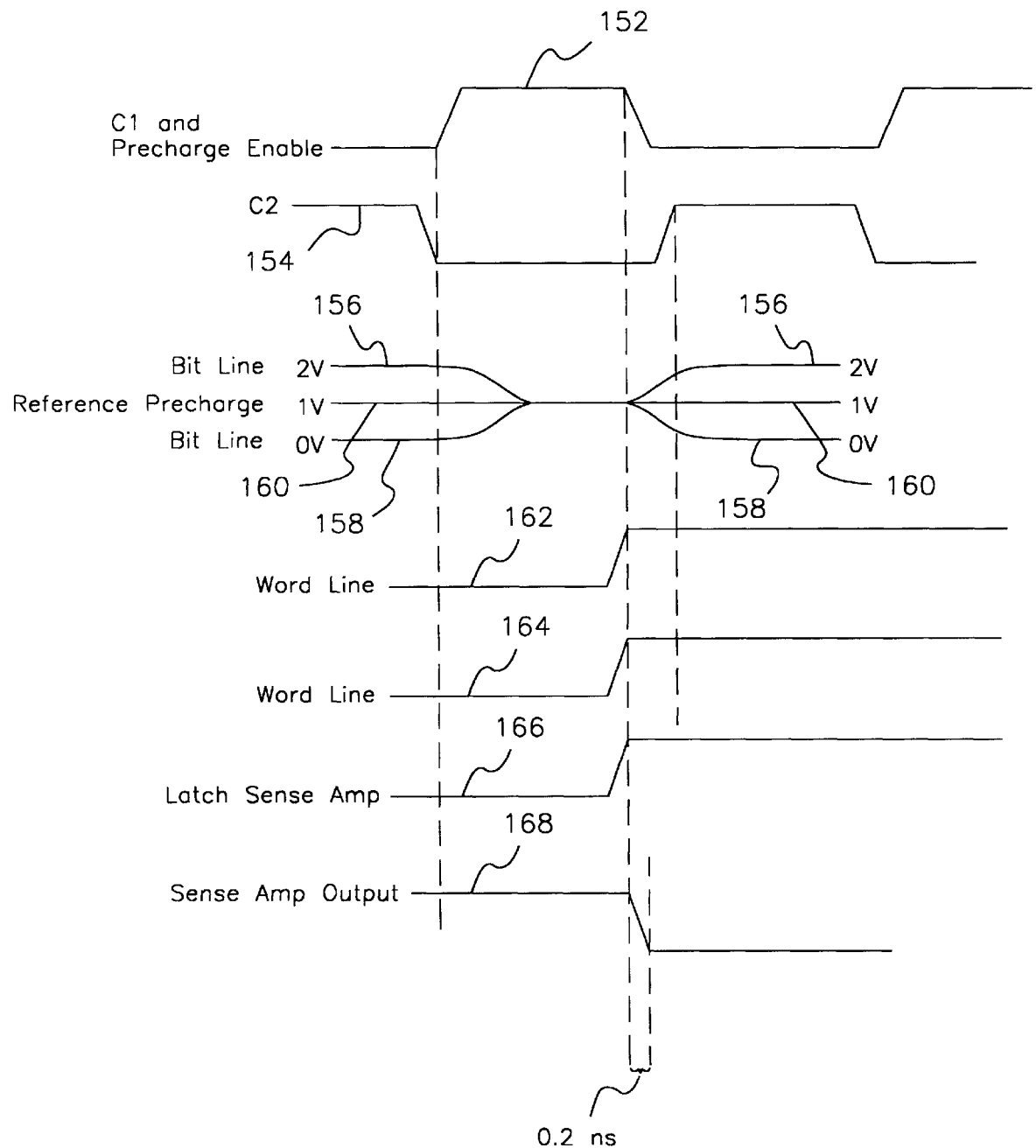
FIG. 5 illustrates the timing of various waveforms corresponding to various signals in the present invention.

To clarify the timing and behavior of reference precharge signal 69 and bit line precharge signals 79 and 89 attention is turned to FIG. 5. FIG. 5 shows sample non-overlapping clocks Cl (waveform 152) and C2 (waveform 154) that may be used in the present invention. Clocks C1 and C2 are shown merely to provide a reference timing in discussing the waveforms shown in FIG. 5.

In the embodiment of the invention discussed in relation to FIG. 5, clock C1 is used as precharge enable signal 97. Thus, waveform 152 also represents the timing and behavior of precharge enable signal 97. As shown in FIG. 5, as soon as the precharge enable signal 97 (waveform 152) makes a transition from low to high, a bit line that is at 0.0 volts begins to make a transition towards 1.0 volts (waveform 158). Also, a bit line that is at 2.0 volts begins to make a transition towards 1.0 volts (waveform 156). As shown in FIG. 5, the reference precharge signal always remains at 1.0 volts (waveform 160) since node 69 is not connected to any bit lines and is not affected by any voltages other than that produced by the reference precharge circuit.

The first time that precharge enable signal 97 goes high, node 69 is brought to 1.0 volts and stays at that level forever (as long as power is provided to the reference precharge circuit). Moreover, every time that precharge enable signal 97 goes high, in addition to maintaining a voltage level of 1.0 volts, node 69 also becomes a low impedance path to ground. Since node 69 always remains at 1.0 volts and further becomes a low impedance node during a RAM read operation, node 69 is used as a reference precharge signal.

A s shown in FIG. 5, the bit line at 2.0 volts (waveform 156) and the bit line at 0.0 volts (waveform 158) both settle to 1.0 volts during the time in which precharge enable signal 97 is high (waveform 152). In this state (i.e. after the bit lines settling to 1.0 volts), the bit lines are "precharged" to 1.0 volts and stand ready to be affected by data to be read from their respective RAM cells. Thus when sufficient time has passed from the point in time when precharge enable signal 97 went high, bit lines 80 and 82 would settle to 1.0 volts. At this time the voltage levels at bit lines 80 and 82, and at reference precharge signal 69 are all at 1.0 volts.

When the bit line s have been precharged to 1.0 volts, the contents of the RAM cells can be read by turning on their respective access transistors. To preserve simplicity, at times the invention is explained only by discussing reading data from RAM cell 60. However, the explanation would apply equally to reading data from RAM cell 70 or any other RAM cell fin the RAM array. Referring to FIG. 3, the contents of RAM cell 60 can be read by sending word line 92 high. As soon as word line 92 makes a transition from low to high, bit line 82 is forced to a lower voltage or a higher voltage depending on whether a "0" or a "1" has been stored in RAM cell 60. Likewise, when word line 98 makes a transition from low to high, the data stored in RAM cell 70 forces bit line 80 to a lower voltage or a higher voltage depending on whether a "0" or a "1" has been stored in RAM cell 70.

Waveform 162 in FIG. 5 represents the timing of a word line, for example word line 92 in FIG. 3 while waveform 164 represents the timing of another word line, for example word line 98 in FIG. 3. As seen in FIG. 5, when the word lines make a transition from low to high, shortly thereafter the bit lines are forced to a lower or higher voltage depending on data stored in their respective RAM cells. It is also shown in FIG. 5 that when data stored in a RAM cell causes a bit line to go lower, the bit line settles at 0.0 volts. The reason is that the inverter in the RAM cell whose output is Connected to the enabled access transistor forces the bit line to go al the way to 0.0 volts. Also, FIG. 5 shows that when data stored in a RAM cell causes a bit line to go higher, the bit line settle s at 2.0 volts. The reason is that the inverter in the RAM cell whose output is connected to the enabled access transistor attempts to force the bit line to go to 3.0 volts, however, due to the 1.0 volt threshold voltage drop which is required to keep the access transistor on, the bit line goes only as high as 2.0 volts at which point the access transistor gets practically turned off. This results in the bit line voltage to settle at 2.0 volts.

Referring again to the invention's reference precharge circuit in FIG. 3, it is noted that the reference precharge circuit is a simple precharge circuit consisting of only three transistors. Moreover, when precharge enable signal 97 is high, the voltage level at reference precharge signal 69 is substantially free of noise. The reason is that node 69 is a low impedance node. In other words, noise that attempts to force node 69 to a value higher than 1.0 volts finds a path to ground through PFET transistor 67. Likewise, noise that tends to force node 69 to a value lower than 1.0 volts finds a path to VDD through NFET transistors 63 and 65. Accordingly, a stable and substantially noiseless precharge voltage at reference precharge signal 69 is generated.

Also, since the precharge voltage is only 1.0 volts, changes in the voltage of a bit line making a transition to 2.0 volts or 0.0 volts are quickly differentiated by the sense amps from their reference voltage of 1.0 volts. In other words, since the bit line precharge voltage and the reference precharge voltage are both merely 1.0 volts, any small change in the bit line voltage is a relatively large percentage change with respect to the reference precharge voltage. Because of this relatively large percentage change, small changes in the bit fine voltage are quickly detected by the bit line sense amps.

The operation of sense amps 84 and 86 is now described by reference to FIGS. 3, 4, and 5. As stated above, line 104 which is a first input of sense amp 100 in FIG. 4, is always connected to reference precharge signal 69 when sense amp 100 is placed in the position of either sense amp 84 or sense amp 86 in FIG. 3. Line 106 which is a second input of sense amp 100 is connected to bit line 80 in the case of sense amp 84 and connected to bit line 82 in the case of sense amp 86 as shown in FIG. 3.

Latch sense amp signal 102 in FIGS. 3 and 4 is low when the word lines are low and no read operation is being performed. When latch sense amp signal 102 is low, NFET transistor 138 is off and PFET transistors 112 and 128 are on. This results in output 140 of sense amp 100 (corresponding to outputs 95 and 91 in sense amps 84 and 86 respectively) to be pulled high to the VDD level, i.e. to be pulled high to 3.0 volts.

When latch sense amp signal 102 is low, first and second input lines 104 and 106 of sense amp 100 do not affect output 140 of the sense amp. The reason is that node 134 which provides output 140 is kept high through PFET transistor 128 whose gate is low. Moreover, NFET transistor 138 whose gate is low is off. Accordingly, the path to ground for node 134 is closed. Thus, regardless of the input values at first and second input lines 104 and 106, output 140 of sense amp 100 remains high as long as latch sense amp signal 102 is low. This is also illustrated by reference to waveforms 166 and 168 in FIG. 5. Waveforms 166 and 168 depict the behavior of latch sense amp signal 102 and sense amp output 140 respectively. As shown in FIG. 5, when latch sense amp signal 102 is low (waveform 166), sense amp output 140 (waveform 168) remains high.

Latch sense amp signal 102 makes a transition from low to high substantially at the same time when the RAM array word lines make their respective transitions from low to high. As shown in FIG. 5, substantially at the same time when waveforms 162 and 164 (corresponding, respectively, to word lines 92 and 98 in FIG. 3) make a transition from low to high, waveform 166 (corresponding to latch sense amp signal 102) makes its transition from low to high.

As discussed above, when the word lines go high the "precharged" bit lines make a transition to a high of 2.0 volts or a low of 0.0 volts depending on the data stored in their respective RAM cell. Thus, one bit line may rise from the precharged voltage of 1.0 volts to a high of 2.0 volts, while another bit line may fall from the precharged voltage of 1.0 volts to a low of 0.0 volts. As shown in FIG. 5, when waveforms 162 and 164 (corresponding to word lines 92 and 98) make a low to high transition the bit lines respond by their respective transitions to a high of 2.0 volts or a low of 0.0 volts.

Since when the word lines are high latch sense amp signal 102 is also high, NFET transistor 138 is on and PFET transistors 112 and 128 are off. This means that depending on the input voltage levels provided at first and second input lines 104 and 106, transistors 112, 118 and 122 in the first leg and transistors 132, 126 and 124 in the second leg of sense amp 100 will determine the output voltage at output 140. Thus when latch sense amp signal 102 goes high, sense amp 100 begins to quickly react to the voltage differential between first input line 104 and second input line 106.

As stated above, first input line 104 is connected to precharge reference signal 69 shown in FIG. 3. Second input line 106 is connected to a corresponding bit line; in the case of sense amp 84, second input line 106 is connected to bit line 80, and in the case of sense amp 86, second input line 106 is connected to bit line 82. In the case that the bit line connected to input line 106 goes from the precharged voltage of 1.0 volts to 2.0 volts, NFET transistor 126 becomes fully conductive, i.e. it becomes fully turned on. This results in PFET transistor 132 and NFET transistor 124 to be configured as an inverter. Moreover, because node 116 was initially at a high voltage before latch sense amp signal 102 went high (as discussed above), the input to the inverter comprised of transistors 132 and 124 (the input being node 116) is high which begins to force node 134 towards ground. This will result in input to NFET transistor 122 and PFET transistor 114 to go low which turns NFET transistor 122 off and turns PFET transistor 114 on. This in turn results in maintaining the voltage at node 116 high. This positive feed back action between the first and second legs of sense amp 100 results in a quick resolution of the voltage levels at nodes 134 and 116 such that node 134 is quickly pulled to ground while node 116 remains at a high voltage level.

Referring to FIG. 5, waveform 168 (corresponding to sense amp output 140) makes a quick transition from high to low when second input line 106 of sense amp 100 is high and w hen the latch sense amp signal 102 is also high. In the preferred embodiment of the invention's sense amp 100, the delay between latch sense amp signal 102 going high and sense amp output 140 settling at its eventual low value is approximately 0.2 nano seconds. This delay is shown in FIG. 5 as the delay between waveform 168 (corresponding to output 140) reaching a low value and waveform 166 (corresponding to latch sense amp signal 102) reaching a high value. The delay is indicated to be 0.2 nano seconds in FIG. 5.

In the case t ha t the bit line connected to second input line 106 of sense amp 100 makes a transition from the precharged voltage of 1.0 volts to a low of 0.0 volts, NFET transistor 126 is turned off. Accordingly, the potential inverter configuration comprising PFET transistor 132 and NFET transistor 124 is never formed. Thus, node 134 which was initially set high before latch sense amp signal 102 went high (as discussed above), remains at a high voltage level. Since node 134 is high, NFET transistor 122 is on while PFET transistor 114 is off. Accordingly, node 116 begins to make a transition from high to low by finding a path to ground through NFET transistors 118, 122 and 138. It Is recalled that first input line 104 is connected to reference precharge signal 69 and remains at 1.0 volts, and NFET transistor 122 is fully on. Although the 1.0 volt voltage level at first input 104 is not high enough to make NFET transistor 118 fully conductive (since the threshold voltage of NFET transistor 118 is 1.0 volts), the 1.0 volt voltage level at first input 104 is sufficient to make transistor 114 barely conductive. As such, node 116 finds a path to ground through NFET transistors 118, 122, and 138.

With transistor 118 conducting some small amount of current and transistor 122 fully on, node 116 will eventually reach 0.0 volts. As node 116 approaches 0.0 volts, node 134 not only remains at its previously high voltage, but also becomes locked at that high voltage because PFET transistor 132 is now fully conductive due to the low gate voltage provided by node 116. It is noted again that the positive feed back established between the first and second legs of sense amp 100 results in quickly latching the voltage level at output 140 at a high value.

It is appreciated that sense amp 100 is particularly suitable for the low precharge voltage of 1.0 volts used in the invention's unique reference precharge circuit and bit line precharge circuits shown in FIG. 3. The reason is that since the threshold voltage of NFET transistor 118 is 1.0 volts, transistor 118 is barely conducting with a voltage of 1.0 volts at its gate provided by the invention's reference precharge circuit. This results in a quick reaction by sense amp 100 when the bit line voltage fed to NFET transistor 126 is high, and also in a quick reaction when the bit line voltage fed to NFET transistor 126 is low in the manner described above. To reiterate, when the bit line voltage at the gate of transistor 126 is high, NFET transistor 118, being barely on, is quickly rendered ineffective due to the low voltage at the gates of PFET transistor 114 and NFET transistor 122 which in turn results in a high voltage at node 116 and a reinforcement of the low voltage at node 134. On the hand, when the bit line voltage at the gate of transistor 126 is low, NFET transistor 118, being already barely on, is quickly rendered effective by aiding to force node 116 lower through transistor 122 whose gate is kept high by node 134. Quickly lowering the voltage at node 116 results in turning on PFET transistor 132 thus reinforcing the high voltage value at node 134.

It is appreciated by the above detailed disclosure that the invention provides a stable and substantially noiseless and low bit line and reference precharge voltages. Moreover, the invention's low precharge voltage of 1.0 volts results in a reduction in the time it takes for an accessed RAM cell to cause a change in the bit line voltage. Furthermore, the invention's unique sense amp reduces the time it takes for small changes in the bit line voltage to be detected.

Thus, a high speed sensing of a dual port static RAM cell has been described.

What is claimed is:

1. A RAM array comprising:
   a RAM cell addressable by an access transistor connected to a bit line;
   a bit line precharge circuit for precharging said bit line to approximately one volt;
   a reference precharge circuit for producing a reference precharge signal;
   a sense amp having first and second sense amp inputs, wherein said first sense amp input is connected to said reference precharge signal and said second sense amp input is connected to said bit line, said sense amp detecting a value stored in said RAM cell when said RAM cell is addressed by said access transistor.

2. The RAM array of claim 1 wherein said reference precharge signal is approximately one volt.

3. The RAM array of claim 1 wherein said reference precharge signal is substantially noise-free.

4. The RAM array of claim 1 wherein said reference precharge signal has a low impedance path to a supply voltage.

5. The RAM array of claim 1 wherein said reference precharge signal has a low impedance path to ground.

6. The RAM array of claim 4 wherein said supply voltage is approximately three volts.

7. The RAM array of claim 1 wherein said sense amp comprises:
   a first leg driven by said first sense amp input;
   a second leg driven by said second sense amp input;
   a latch sense amp signal for providing a ground path for said first and second legs;
   said second leg providing a sense amp output, wherein a voltage at said sense amp output corresponds to a difference between a voltage at said first sense amp input and a voltage at said second sense amp input.

8. A RAM array comprising:
   a RAM cell addressable by an access transistor connected to a bit line;
   a bit line precharge circuit precharging said bit line to a bit line precharge voltage less than a supply voltage;
   a reference precharge circuit producing a reference precharge signal;
   a sense amp having first and second sense amp inputs, wherein said first sense amp input is connected to said reference precharge signal and said second sense amp input is connected to said bit line, said sense amp detecting a value stored in said RAM cell when said RAM cell is addressed by said access transistor.

9. The RAM array of claim 8 wherein said supply voltage is approximately three volts.

10. The RAM array of claim 8 wherein said bit line precharge voltage is approximately one volt.

11. The RAM array of claim 8 wherein said reference precharge signal has a voltage of approximately one volt.

12. The circuit of claim 8 wherein said sense amp comprises:
   a first leg having a first input transistor, a gate of said first input transistor being driven by said first sense amp input;
   a second leg having a second input transistor, a gate of said second input transistor being driven by said second sense amp input;
   a latch sense amp signal for providing a ground path for said first and second legs.

13. A sense amp comprising:
   a first leg having a first input transistor, a gate of said first input transistor being driven by a first sense amp input;
   a second leg having a second input transistor, a gate of said second input transistor being driven by a second sense amp input;
   said second sense amp input being coupled to a bit line, said bit line being precharged to a bit line precharge voltage less than a supply voltage;
   a latch sense amp signal for providing a ground path to said first and second legs;
   said second leg providing a sense amp output, wherein a voltage at said sense amp output corresponds to a difference between a voltage at said first sense amp input and a voltage at said second sense amp input.

14. The sense amp of claim 13 wherein said bit line is in a RAM array, said RAM array comprising a RAM cell addressable by an access transistor connected to said bit line.

15. The sense amp of claim 13 wherein said supply voltage is approximately three volts.

16. The sense amp of claim 14 wherein said supply voltage is approximately three volts.

17. The sense amp of claim 13 wherein said bit line precharge voltage is approximately one volt.

18. The sense amp of claim 14 wherein said bit line precharge voltage is approximately one volt.

* * * * *